United States Patent
Ohnishi et al.

(10) Patent No.: US 8,133,402 B2
(45) Date of Patent: Mar. 13, 2012

(54) PATTERN FORMING METHOD, CHARGED PARTICLE BEAM WRITING APPARATUS, AND RECORDING MEDIUM ON WHICH PROGRAM IS RECORDED

(75) Inventors: Takayuki Ohnishi, Shizuoka (JP); Hirohito Anze, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 1078 days.

(21) Appl. No.: 12/023,384

(22) Filed: Jan. 31, 2008

(65) Prior Publication Data
US 2008/0185538 A1    Aug. 7, 2008

(30) Foreign Application Priority Data
Feb. 1, 2007   (JP) ................................. 2007-022702

(51) Int. Cl.
C03C 15/00 (2006.01)
(52) U.S. Cl. ................. 216/41; 216/48; 216/59; 216/66
(58) Field of Classification Search .................... 216/41, 216/48, 59, 66
See application file for complete search history.

(56) References Cited

U.S. PATENT DOCUMENTS

| | | | | |
|---|---|---|---|---|
| 6,461,800 B1 * | 10/2002 | Tsujita | ........................... | 430/329 |
| 6,561,706 B2 * | 5/2003 | Singh et al. | .................... | 396/611 |
| 6,569,692 B1 * | 5/2003 | Bode et al. | ....................... | 438/14 |
| 6,613,500 B1 * | 9/2003 | Phan et al. | ..................... | 430/394 |
| 6,716,570 B2 * | 4/2004 | Nagarajan et al. | ............. | 430/311 |
| 2002/0187434 A1 * | 12/2002 | Blatchford et al. | ........... | 430/322 |
| 2004/0058533 A1 * | 3/2004 | Sakai et al. | .................... | 438/689 |
| 2005/0167397 A1 * | 8/2005 | Chen et al. | ....................... | 216/59 |
| 2007/0224525 A1 * | 9/2007 | Schaar et al. | .................... | 430/22 |

FOREIGN PATENT DOCUMENTS
JP         9-293670        11/1997

* cited by examiner

Primary Examiner — Binh X Tran
(74) Attorney, Agent, or Firm — Oblon, Spivak, McClelland, Maier & Neustadt, L.L.P.

(57) ABSTRACT

A pattern forming method includes performing a first resist development during a first time period to a substrate obtained by coating a resist film having a predetermined thickness onto a predetermined film to be etched, measuring the film thickness of the resist film after the first resist development, writing a predetermined pattern corrected in dimension on the basis of an amount of reduction in thickness of the resist film on the resist film by using a charged particle beam, performing a second resist development during a second time period which is longer than the first time period to the substrate after writing the pattern, and etching the predetermined film to be etched by using the resist film after the second resist development as a mask.

9 Claims, 10 Drawing Sheets

Coating Irregularity
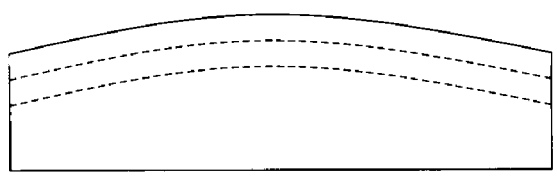
Film Thickness Is Reduced At Equal Intervals
Sensitivity Irregularity
Development Irregularity
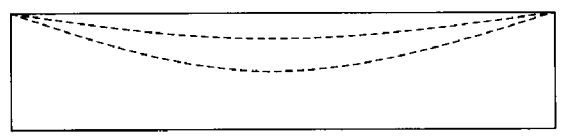
Amount Of Reduction In Thickness Changes Depending Position
FIG. 4A
FIG. 4B

PATTERN FORMING METHOD, CHARGED PARTICLE BEAM WRITING APPARATUS, AND RECORDING MEDIUM ON WHICH PROGRAM IS RECORDED

CROSS-REFERENCE TO RELATED APPLICATION

This application is based upon and claims the benefit of priority from prior Japanese Patent Application No. 2007-022702 filed on Feb. 1, 2007 in Japan, the entire contents of which are incorporated herein by reference.

BACKGROUND OF THE INVENTION

1. Field of the Invention

The present invention relates to a pattern forming method and a charged particle beam writing apparatus.

For example, the present invention relates to a dimension correction method in electronic beam writing which writes a pattern by using an electron beam.

2. Related Art

A lithography technique which makes the advance of miniaturization of a semiconductor device is a very important and an only process which generates a pattern in semiconductor manufacturing processes. In recent years, with a high degree of integration of an LSI, a circuit line width required for a semiconductor device is miniaturized every year. In order to form a desired circuit pattern to the semiconductor device, a high-precision master pattern plate (also called a reticle or a mask) is necessary. An electron beam writing technique inherently has an excellent resolution and is used in production of a high-precision master plate or a mask.

FIG. 11 is a conceptual diagram for explaining an operation of a conventional variable shaping electron beam writing apparatus.

In the variable shaping electron beam (EB) writing apparatus, a pattern will be written as follows. In first aperture 410, an oblong (for example, rectangular) opening 411 to shape an electron beam 330 is formed. In a second aperture 420, a variable shaping opening 421 to shape the electron beam 330 passing through the rectangular opening 411 into a desired oblong shape is formed. The electron beam 330 irradiated from a charged particle source 430 and passing through the rectangular opening 411 is deflected by a deflector. The electron beam 330 passes through a part of the variable shaping opening 421 and is irradiated on a target workpiece 340 placed on a stage. At this time, the stage continuously moves in a predetermined direction (for example, an X direction). More specifically, an oblong shape which can pass through both the rectangular opening 411 and the variable shaping opening 421 is written in a writing region of the target workpiece 340. A scheme which causes an electron beam to pass through both the rectangular opening 411 and the variable shaping opening 421 to form an arbitrary shape is called a variable shaping scheme. With respect to the variable shaping electron beam writing apparatus, disclosed documents are present (for example, see Published Unexamined Japanese Patent Application Publication No. 9-293670 (JP-A-9-293670)).

A resist film is coated to the target workpiece 340. The electron beam 330 is irradiated on the resist film to form a pattern. The pattern is developed to form a resist pattern. By using the resist pattern as a mask, an underlying light-shielding film is etched. The resist pattern is removed, and cleaning is performed, so that a mask for exposing a semiconductor device pattern, for example, is completed.

In this case, as a material of the resist film for an electron beam, a chemical amplification type resist is used. However, the chemical amplification type resist has a problem that resist sensitivity irregularity occurs between mask substrates and in a substrate. For this reason, a variation in pattern dimension CD is caused. Therefore, the precision of the CD is consequently deteriorated. In particular, the precision of the CD deteriorates in a so-called global region whose influence range is the order of a few millimeters to a few centimeters. In a conventional technique, a variation in global CD suddenly occurs, and the variation cannot be detected until a pattern is developed. For this reason, the variation is difficult to be corrected in advance. Not only the resist sensitivity irregularity, but also development irregularity or resist coating irregularity causes a variation in CD. Consequently, the precision of the CD is deteriorated.

As described above, the resist sensitivity irregularity, the development irregularity, or the resist coating irregularity causes a variation in CD and deteriorates the precision of the CD. For this reason, it is desirable to correct the variation in CD and the precision of the CD in pattern writing. Effective means to solve the problems is not conventionally established.

BRIEF SUMMARY OF THE INVENTION

It is an object of embodiments of the present invention to provide a pattern forming method in which an amount of variation in dimension caused by resist sensitivity irregularity, development irregularity, or resist coating irregularity is corrected.

A pattern forming method according to an aspect of the present invention includes performing a first resist development during a first time period to a substrate obtained by coating a resist film having a predetermined thickness onto a predetermined film to be etched, measuring the film thickness of the resist film after the first resist development, writing a predetermined pattern corrected in dimension on the basis of an amount of reduction in thickness of the resist film on the resist film by using a charged particle beam, performing a second resist development during a second time period which is longer than the first time period to the substrate after writing the pattern, and etching the predetermined film to be etched by using the resist film after the second resist development as a mask.

A charged particle beam writing apparatus according to an aspect of the present invention includes a correction information generator configured to receive a film thickness of a resist film obtained by film thickness measurement in advance, to calculate an amount of reduction in thickness, and to generate correction information to correct a dimension of a predetermined pattern on the basis of the amount of reduction in thickness, a correcting unit configured to correct a dimension of the predetermined pattern on the basis of the correction information, and a writing unit configured to write the predetermined pattern with a corrected dimension on a target workpiece by using a charged particle beam.

A readable recording medium, according to an embodiment of the present invention, on which a program executed by a computer is recorded, includes a process of receiving a film thickness of a resist film obtained by film thickness measurement in advance to calculate an amount of reduction in thickness, and a process of reading correlation information from a storage device in which the correlation information is stored, generating correction information to correct a dimension of a predetermined pattern on the basis of the correlation

BRIEF DESCRIPTION OF THE DRAWINGS

FIGS. 4A and 4B are diagrams showing an example of resist sensitivity irregularity, development irregularity, and resist coating irregularity in the first embodiment.

DETAILED DESCRIPTION OF THE INVENTION

In the following embodiments, as an example of a charged particle beam, an explanation is given about a configuration in which an electron beam is used. As the charged particle beam, not only an electron beam but also a beam with the charged particle beam such as an ion beam may be used.

First Embodiment

Figure 1:
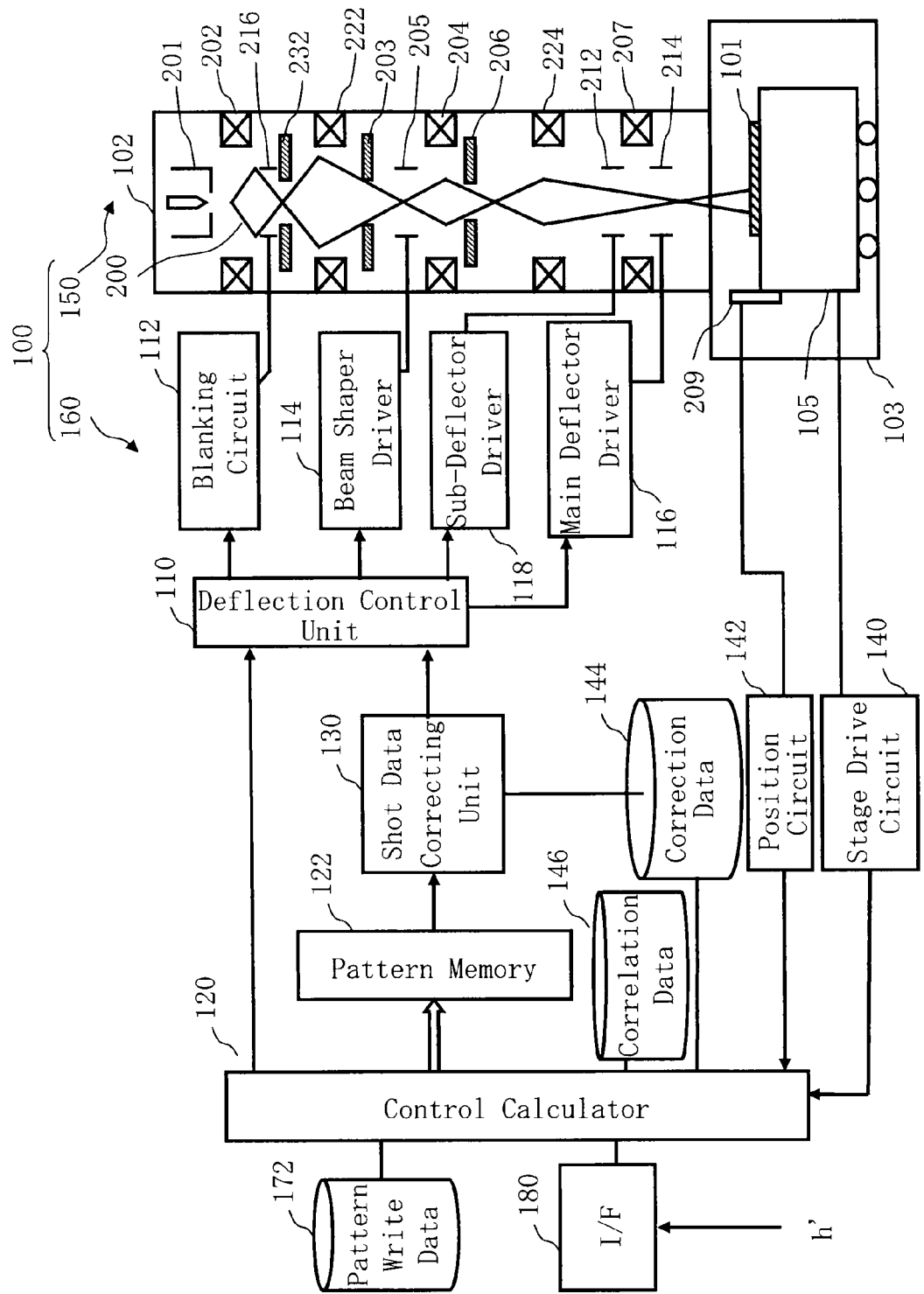
FIG. 1 is a conceptual diagram showing a configuration of a writing apparatus according to a first embodiment.

FIG. 1 is a conceptual diagram showing a configuration of a writing apparatus according to a first embodiment.

In FIG. 1, a writing apparatus 100 writes a predetermined pattern on a target workpiece 101. As the target workpiece 101, for example, a mask for fabricating a semiconductor device is included. The writing apparatus 100 includes a writing unit 150 and a control unit 160. The writing apparatus 100 serves as an example of a charged particle beam writing apparatus. The writing unit 150 has an electron lens barrel 102 and a writing chamber 103. In the electron lens barrel 102, an electron gun assembly 201, an illumination lens 202, a blanking (BLK) deflector 216, a BLK aperture plate 232, a projection lens 222, a first aperture plate 203, a shaping deflector 205, a projection lens 204, a second aperture plate 206, a reduction lens 224, a sub-deflector 212, an objective lens 207, and a main deflector 214. In the writing chamber 103, an XY stage 105 is arranged, and the target workpiece 101 on which a pattern is written is placed on the XY stage 105. On the XY stage 105, a mirror 209 for measuring a laser wavelength is arranged. On the control unit 160 has a deflection control unit 110, a BLK circuit 112, a beam shaper driver 114, a main deflector driver 116, a sub-deflector driver 118, a control calculator 120, a pattern memory 122, a shot data correcting unit 130, a stage drive circuit 140, a position circuit 142, magnetic disk devices 144, 146, and 172, and an interface circuit 180. The deflection control unit 110, the control calculator 120, the pattern memory 122, the shot data correcting unit 130, the stage drive circuit 140, the position circuit 142, the magnetic disk devices 144, 146, and 172, and the interface circuit 180 are connected to each other through a bus (not shown). On the deflection control unit 110, the BLK circuit 112, the beam shaper driver 114, the main deflector driver 116, and the sub-deflector driver 118 are connected through the bus (not shown). Writing data is stored in the magnetic disk device 172. In the magnetic disk device 146, correlation data between a film thickness h' and ΔCD of a resist film (will be described later) and correlation data between an amount of reduction in thickness Δh and the ΔCD of the resist film are stored. The electron lens barrel 102 and the writing chamber 103 are evacuated by a vacuum pump (not shown) to have vacuum atmospheres having pressures lower than the atmospheric pressure. In FIG. 1, constituent elements necessary for explanation of the first embodiment are shown. The writing apparatus 100 may include other configuration elements.

An electron beam 200 emitted from the electron gun assembly 201 illuminates the entire area of the first aperture plate 203 having an oblong (for example, rectangle) hole by means of the illumination lens 202 and the projection lens 222. In this case, the electron beam 200 is shaped to have an oblong, for example, a rectangle first. The electron beam 200 of the first aperture image passing through the first aperture plate 203 is projected on the second aperture plate 206 by the projection lens 204. A position of the first aperture image on the second aperture plate 206 is controlled by the shaping deflector 205. As a result, a beam shape and a beam dimension can be changed. The electron beam 200 of the second aperture image passing through the second aperture plate 206 is reduced by the reduction lens 224. The electron beam 200 is focused by the objective lens 207. The electron beam 200 is deflected by the sub-deflector 212 and the main deflector 214 and irradiated on the target workpiece 101 on the XY stage 105. During pattern writing, a pattern is written while continuously moving the XY stage 105. A deflection voltage of the shaping deflector 205 is controlled by the beam shaper driver 114 controlled by the deflection control unit 110. A deflection voltage of the sub-deflector 212 is controlled by the sub-deflector driver 118 controlled by the deflection control unit 110. A deflection voltage of the main deflector 214 is controlled by the main deflector driver 116 controlled by the deflection control unit 110.

As described above, the electron beam 200 emitted from the electron gun assembly 201 is irradiated on a desired position of the target workpiece 101 on the XY stage 105 movably arranged. In this case, when beam irradiation time of the electron beam 200 on the target workpiece 101 reaches beam irradiation time at which a beam of a desired dose is irradiated on the target workpiece 101, the electron beam 200 is prevented from reaching the target work piece 101 surface. For this purpose, the electron beam 200 is deflected by the BLK deflector 216, and the electron beam 200 is cut by the BLK aperture plate 232. In this manner, the electron beam 200 can be prevented from being excessively irradiated on the target workpiece 101. The deflection voltage of the BLK deflector 216 is controlled by the BLK circuit 112 controlled by the deflection control unit 110.

In a beam-ON (blanking-OFF) state, the electron beam 200 emitted from the electron gun assembly 201 can reach the target workpiece 101. On the other hand, in a beam-ON (blanking-ON) state, the electron beam 200 is cut by the BLK aperture plate 232. The beam irradiation time t is adjusted to make it possible to adjust a dose of the electron beam.

In this case, before a pattern is written by the writing apparatus 100, correlation data of an initial film thickness h, an amount of reduction in film thickness Δh, and ΔCD of the resist film is acquired first.

Figure 2:
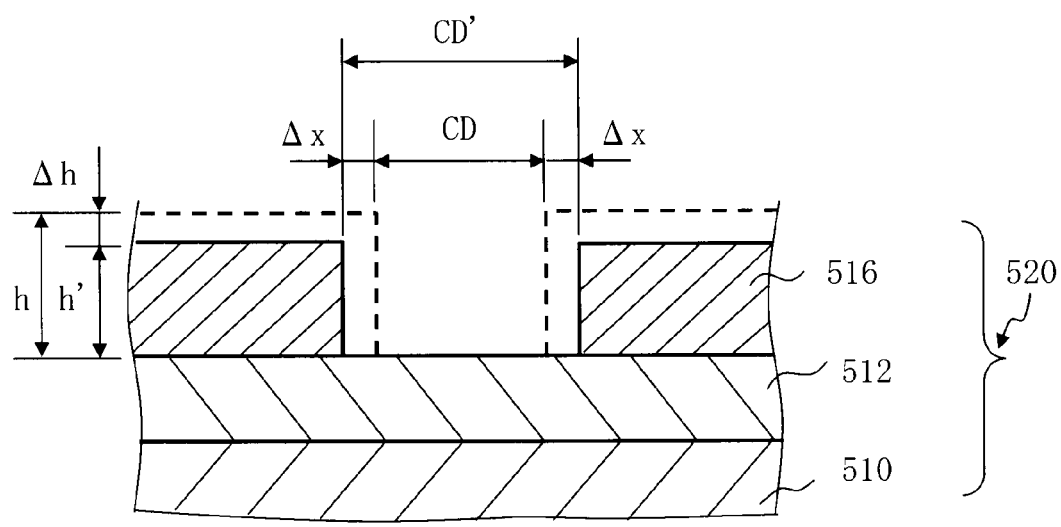
FIG. 2 is a diagram for explaining a correlation between an amount of reduction in thickness and a CD of a resist film according to the first embodiment.

FIG. 2 is a diagram for explaining a correlation between the amount of reduction in film thickness and the ΔCD of the resist film in the first embodiment.

An evaluation substrate 520 for evaluation is prepared. The evaluation substrate 520 has the following configuration. More specifically, a chromium (Cr) film 512 serving as a light-shielding film on a glass substrate 510. A resist film 516 is formed on the Cr film 512. In order to widely examine the relationship between the initial film thickness h and the ΔCD, a substrate having a large film thickness distribution is desirably used. As a material of the resist film 516, a chemical amplification type resist is used. In this case, a positive chemical amplification resist is used. The film thickness h of the resist film 516 is measured in advance. The evaluation substrate 520 is placed on the XY stage 105 of the writing apparatus 100, and a plurality of line patterns each having a predetermined width CD are written. The substrate is dipped in a developing solution for a predetermined period of time t to perform a resist development to the substrate. A pattern width CD' and a film thickness h' of the resist film after the development are measured. Subsequently, the substrate is dipped in the developing solution for the predetermined period of time t to perform a resist development to the substrate. The pattern width CD' and the film thickness h' of the resist film after the development are measured. The operation will be repeated. In this manner, relationships between the ΔCD, a pre-development film thickness h, and an amount of reduction in film thickness Δh can be obtained.

Figure 3:
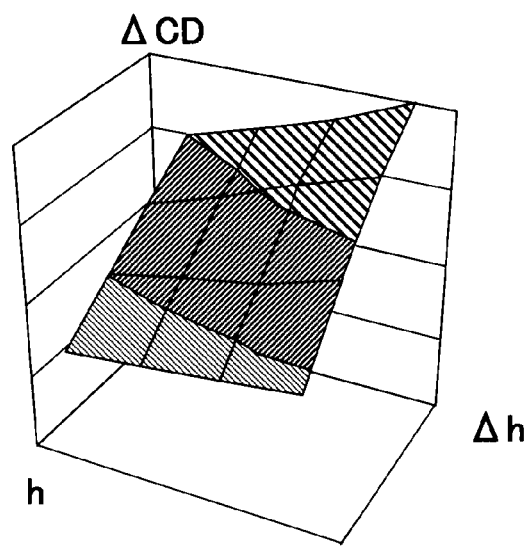
FIG. 3 is a diagram showing an example of a correlation between an amount of reduction in thickness and ΔCD of the resist film according to the first embodiment.

FIG. 3 is a diagram showing an example of correlations between the initial film thickness, the amount of reduction in film thickness, and the ΔCD of the resist film in the embodiment.

FIGS. 4A and 4B are diagrams showing an example of resist sensitivity irregularity, development irregularity, and resist coating irregularity in the first embodiment.

When the pattern width CD' of each developing time t is measured, correlations between the initial film thickness h, the amount of reduction in film thickness Δh, and the variation in dimension ΔCD given by CD'-CD as shown in FIG. 3 can be obtained. In this case, as shown in FIG. 2, by resist development, on the surface of the resist film 516, the film thickness h is reduced to the film thickness h' by Δh. On the other hand, with respect to a pattern dimension, the width CD is changed into CD' by ΔCD. A resist material on the surface of the resist film 516 and a resist material of the pattern wall surface reduce with a predetermined correlation. When the coating irregularity occurs, films are reduced at equal intervals regardless of positions as shown in FIG. 4A. However, when development irregularity and resist sensitivity irregularity occur in a spray type developing device, as shown in FIG. 4B, amounts of reduction in film thickness change depending on positions. Therefore, the ΔCD caused by the resist coating irregularity is related to the film thickness h', and the ΔCD caused by the development irregularity and the resist sensitivity irregularity is related to the amount of reduction in film thickness Δh. Therefore, the ΔCD can be calculated from the film thickness h' and the amount of reduction in film thickness Δh with reference to the graph in FIG. 3. The ΔCD caused by the resist coating irregularity is determined regardless of developing time, and the ΔCD caused by the development irregularity and the resist sensitivity irregularity changes depending on developing time. For this reason, as will be described later, developing time in pre-development and developing time in real development are made different from each other. When the ΔCD in the real development is to be calculated by Δh in the pre-development, Δh which is a term of the development irregularity and the sensitivity irregularity must be corrected by a coefficient k, and an amount of reduction in film thickness adapted to FIG. 3 is kΔh. In this case, k=t2/t1 is given, where t1 is time of pre-development, and t2 is time of real development. Therefore, when the film thickness h' after the pre-development and the amount of reduction in film thickness Δh are known, a variation of pattern width ΔCD in real development can be predicted. As described above, an increase in pattern width in real development can be calculated from the graph in FIG. 3. Therefore, when the pattern width is corrected by the increase in size in the real development to write a pattern, the pattern having a desired dimension can be achieved after the real development. The explanation will be made along steps.

In this case, not only a chemical amplification type resist but also a main-chain-scission type resist which is a non-chemical amplification type resist can be preferably used as the material of the resist film.

Figure 5:
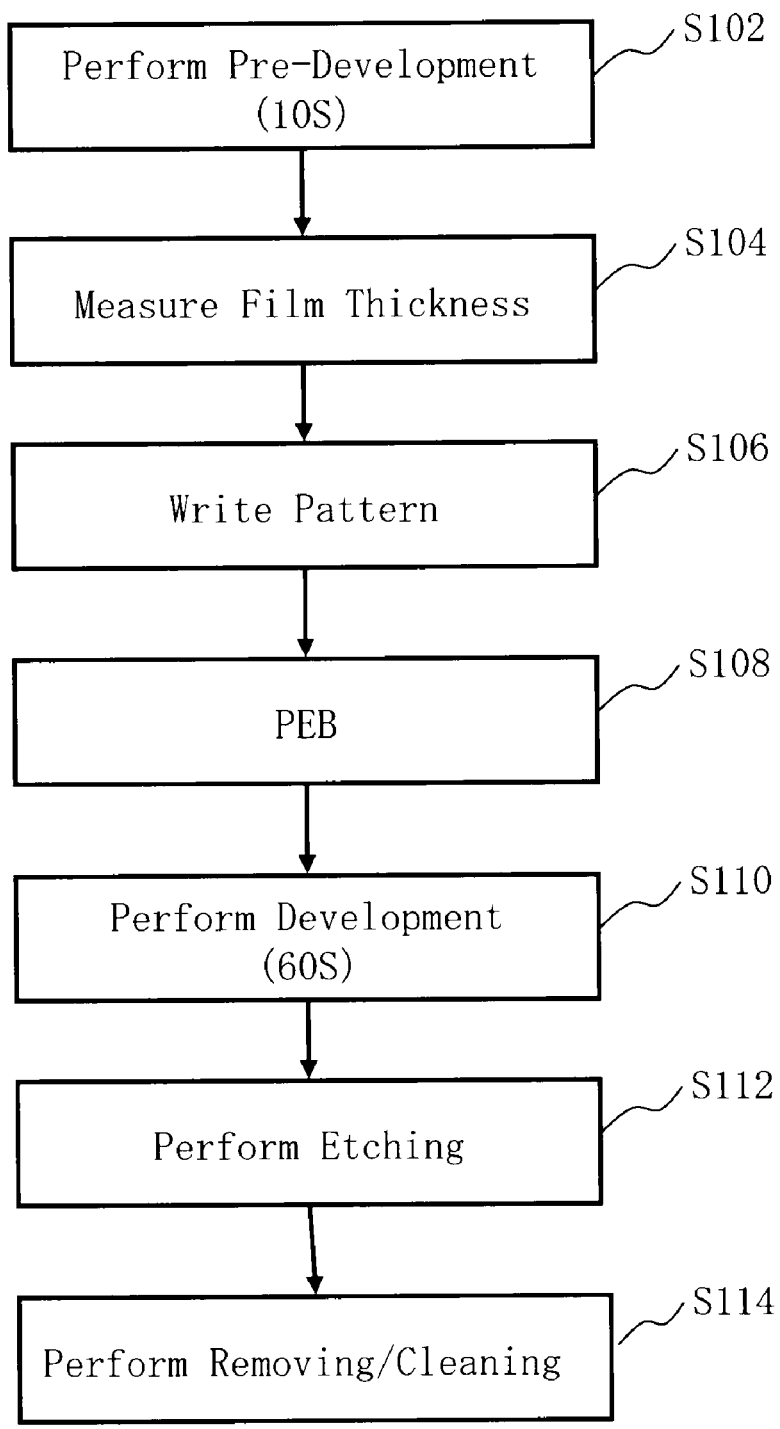
FIG. 5 is a flow chart showing main steps of a pattern forming method according to the first embodiment.

FIG. 5 is a flow chart showing main steps of a pattern forming method according to the first embodiment.

In FIG. 5, in the pattern forming method, a series of steps, i.e., a short-term pre-developing step (S102), a film thickness measuring step (S104) which measures a film thickness in advance in pattern writing, a writing step (S106), a PEB (Post Exposure Bake) step (S108), a developing step (S110), an etching step (S112), and a removing/cleaning step (S114) are performed.

Figure 6A:
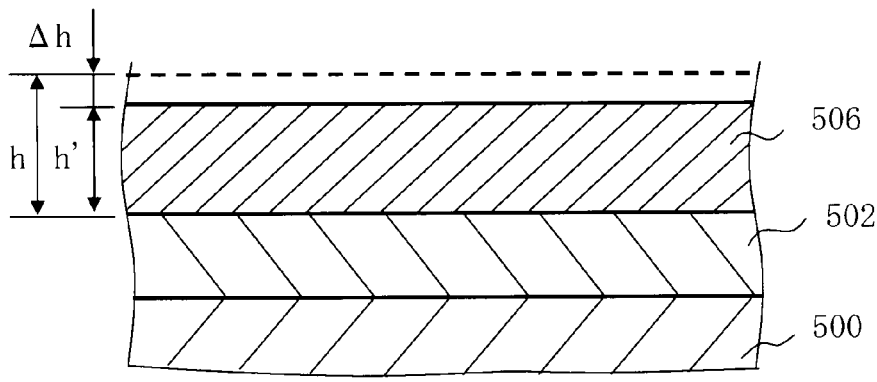
FIGS. 6A to 6C are process sectional views in the steps in FIG. 5.
Figure 6B:
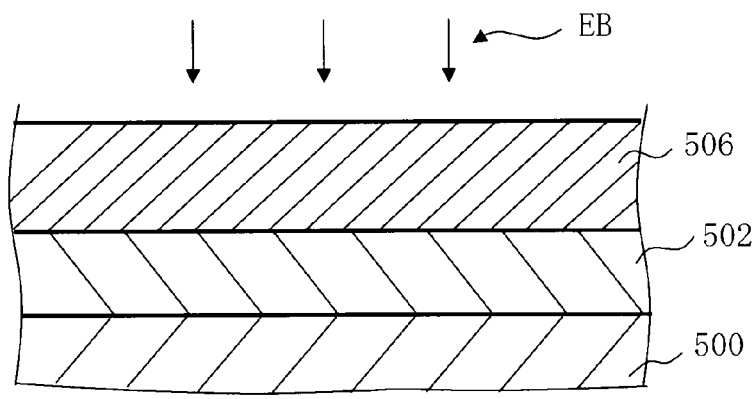
Figure 6C:
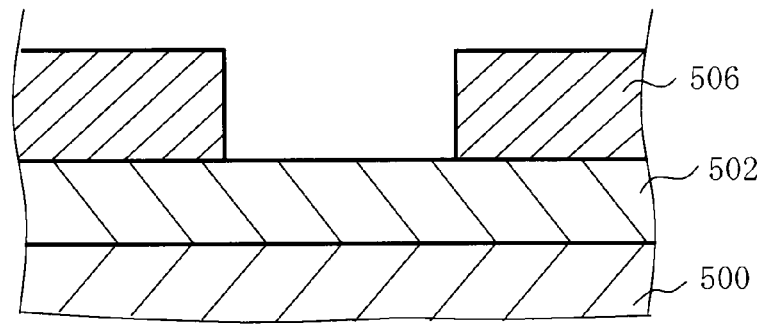

FIGS. 6A to 6C are process sectional views in steps in FIG. 5. In FIGS. 6A to 6C, the developing step (S102) to the developing step (S110) in FIG. 5 are shown.

IN FIG. 6A, as the short-term pre-developing step, the target workpiece 101 obtained by coating a resist film 506 having a film thickness h onto a Cr film 502 is dipped in a developing solution for a first period of time t1 to perform a resist development. The target workpiece 101 on which a pattern is to be written has the following configuration. More specifically, the Cr film 502 serving as a light-shielding film is formed on a glass substrate 500. The resist film 506 is formed on the Cr film 502. As the material of the resist film 506, the same chemical amplification type resist as that of the evaluation substrate 520 is used. In particular, resist materials of the same lot are preferably used. For example, resist film are preferably coated to the evaluation substrate 520 for evaluation and the target workpiece 101 serving as a substrate for pattern writing by using resist material put in the same vessel at the same time. The Cr film 502 is an example of a film to be etched. In this case, for example, the period of time t1 is preferably set at about 10 s shorter than development time after writing the pattern. The period of time t1 is preferably set such that an amount of reduction in film thickness is 5% or less.

As the film thickness measuring step, a film thickness h' of the resist film 506 after the development is measured. When the film thickness h' is measured to calculate a difference between the film thickness h' and the original film thickness h, the amount of reduction in film thickness Δh can be obtained.

Figure 7:
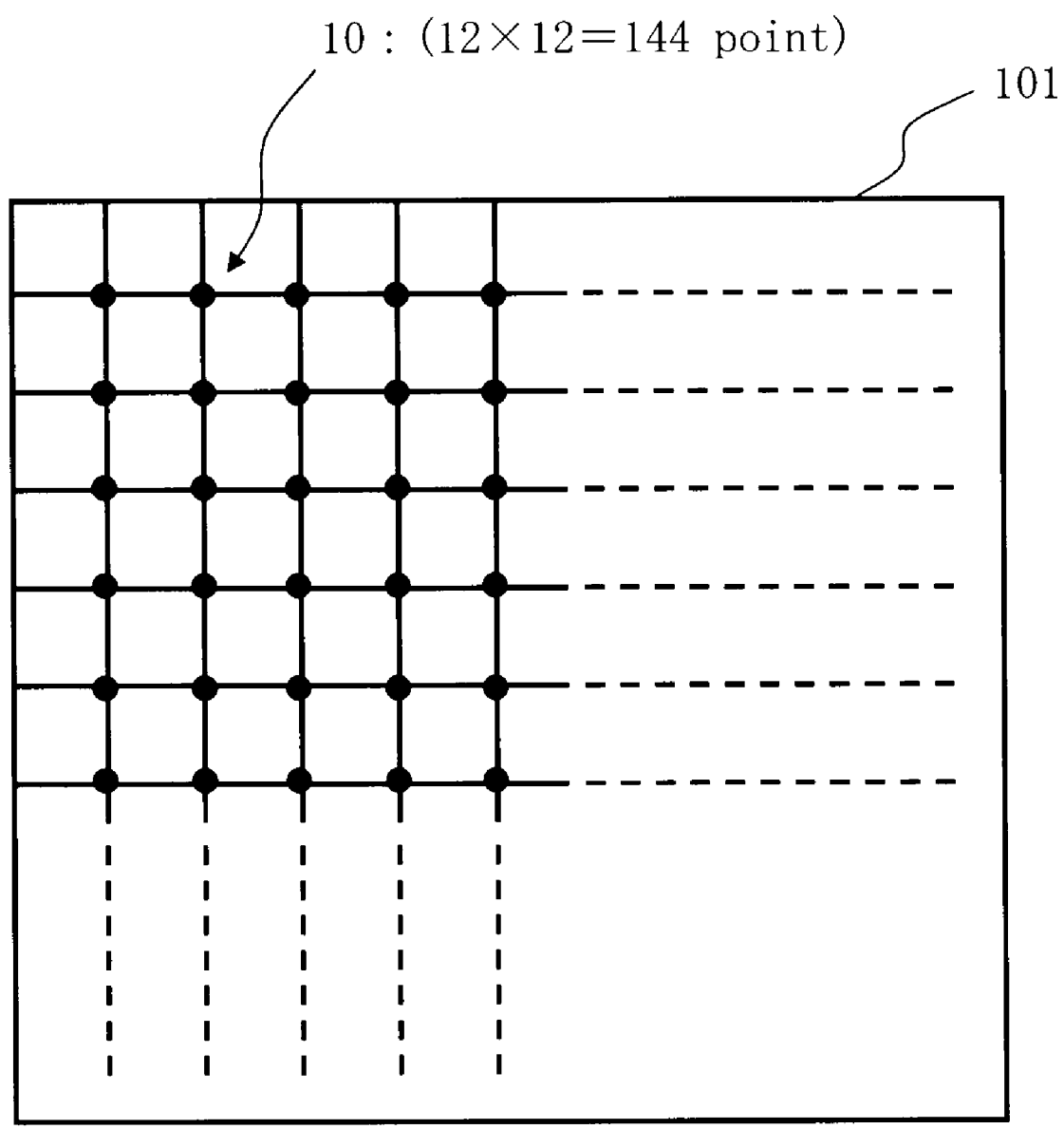
FIG. 7 is a diagram showing an example of a film thickness measurement position in the first embodiment.

FIG. 7 is a diagram showing an example of a film thickness measurement position in the first embodiment.

In FIG. 7, a writing region of the target workpiece 101 is virtually divided into grids each having a predetermined dimension, and the film thicknesses are measured at 12×12=144 positions. In the writing step (will be described later), correction is performed on the basis of an amount of reduction of film thickness at each of the positions. In this manner, film thicknesses are measured in the plurality of regions to make it possible to correct a pattern dimension on the basis of the amount of reduction in film thickness depending on the positions. The correction between the grids may be compensated for by using a smoothed value.

In FIG. 6B, as the writing step, by using the electron beam 200, a predetermined pattern the dimension of which is corrected on the basis of the film thickness h' and the amount of reduction in film thickness Δh of the resist film is formed on the resist film 506. In the writing apparatus 100, the control calculator 120 converts the writing data to generate shot data serving as an in-apparatus format. The generated shot data is temporarily stored in the pattern memory 122. In this case, the writing data is constituted by a plurality of files. The control calculator 120 receives writing data corresponding to each of the predetermined regions and converts the writing data. For this reason, shot data of each of the predetermined regions is accumulated in the pattern memory 122. When the accumulation of the data of all the regions is completed, pattern writing is started. In this case, the control calculator 120 receives the film thickness h' of the resist film 506 obtained by the film thickness measurement through the I/F circuit 180. A difference between the input film thickness h' and the original film thickness obtained when the resist film 506 is coated is calculated to calculate the amount of reduction in film thickness Δh. The original film thickness h may be set in the apparatus in advance. The control calculator 120 reads correlation data between the film thickness h' and the ΔCD and correlation data between the amount of reduction in film thickness Δh and the ΔCD to generate correction data to correct the dimension of the predetermined pattern on the basis of the film thickness h' and the amount of reduction in film thickness Δh. The correction data is output to a magnetic disk device 144.

As described above, the variation in dimension ΔCD after the real development can be calculated from FIG. 3. For this reason, the control calculator 120 generates correction data (an example of correction information) to perform correction which narrows the dimension CD of the pattern in the pattern writing by an increase of the pattern dimension.

The correction data generated as described above, is stored in the magnetic disk device 144. In this manner, the control calculator 120 serves as an example of a correction information generator to generate correction information. The shot data correcting unit 130 reads shot data from the pattern memory 122. The dimension CD of the pattern is corrected on the basis of the correction data. As described above, when the pattern dimension increases by the development, correcting is performed such that the pattern dimension is narrowed by the increase in dimension. More specifically, the pattern dimension CD is corrected to be a dimension obtained by subtracting the increase in pattern dimension ΔCD after the real development. In other words, the pattern dimension CD is corrected to a value obtained by subtracting a value calculated by using the amount of reduction in film thickness Δh and a ratio of the first period of time t1 to the second period of time t2 from the pattern dimension CD. Shot data is output to the deflection control unit 110 after its pattern dimension is corrected.

On the other hand, in the stage drive circuit 140, the XY stage 105 is moved at a stage moving speed along the shot data. The position of the XY stage 105 is laser-ranged by the position circuit 142. After causing a laser to be reflected by the mirror 209 and receiving a reflected beam the position circuit 142 can measure the position of the XY stage 105. The position information is transmitted to the control calculator 120. The stage moving speed is also transmitted to the control calculator 120. When a region written on the target workpiece 101 is set in a deflectable range between the main deflector 214 and the sub-deflector 212, pattern writing is started. A signal required for blanking is output from the deflection control unit 110 to the BLK circuit 112. A signal necessary for beam shaping is also output to the beam shaper driver 114. A signal necessary to designate a main deflection position is output to the main deflector driver 116. A signal necessary to designate a sub-deflection position is output to the sub-deflector driver 118. The electron beam 200 deflected by the respect deflectors passes through respective lenses to reach the target workpiece 101, and a predetermined pattern having a corrected dimension is written on the target workpiece 101.

As described above, pattern writing in a certain region is performed. In the control calculator 120, shot data of the next region is generated in parallel to the pattern writing. After data of the previous region is read, the pattern memory 122 accumulates the data of the next region. Upon completion of accumulation of the data of the next region, when the pattern writing of the previous region is ended, pattern writing of the next region is started. Pattern writings are sequentially performed by repeating this operation.

As the PEB step, upon completion of the pattern writing, a PEB process is performed to the target workpiece 101 on which the pattern is written.

In FIG. 6C, as the developing step, after the pattern writing, the target workpiece 101 is dipped in a developing solution for the second period of time t2 longer than the period of time t1 to perform a resist development. In this manner, a resist pattern is formed. In this case, for example, the period of time t2 is preferably set at about 60 s longer than the period of time t1 for the pre-development.

Figure 8A:
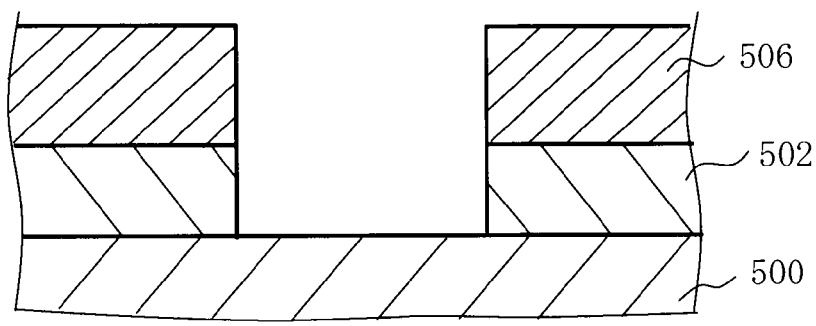
FIGS. 8A and 8B are process sectional views in the steps in FIG. 5.
Figure 8B:
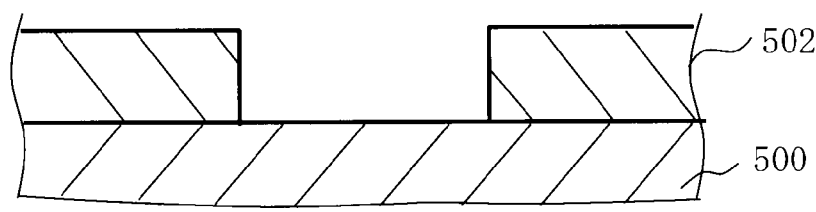

FIGS. 8A and 8B are process sectional views in each step in FIG. 5. FIGS. 8A and 8B show the etching step (S112) to the removing/cleaning step (S114) in FIG. 5.

In FIG. 8A, as the etching step, the film to be etched is etched by using the resist film obtained after the second resist development as a mask. In the etching, a reactive ion etching (RIE) method which is one of anisotropic dry etching techniques is preferably used. When the anisotropic etching is used, an opening can be almost vertically formed in the surface of the Cr film 502.

In FIG. 8B, as the removing/cleaning step, the unnecessary resist film 506 on the etched Cr film 502 is removed by ashing or the like. Thereafter, the substrate is cleaned to make it possible to manufacture a mask substrate on which a pattern is formed.

With the above steps, for example, a variation of the pattern caused by developing irregularity between the chemical amplification type resist and the substrate or pattern irregularity can be corrected.

As described above, when the film thickness of the resist film obtained after the resist development for the first period of time t1 is measured before pattern writing, an amount of reduction in film thickness Δh of the resist film can be obtained. As a result, a variation in dimension of the resist pattern caused by the resist development for the second period of time t2 can be obtained. In this manner, the variation in dimension in development after the pattern writing can be obtained from the amount of reduction in film thickness. The variation in dimension is caused by resist irregularity, development irregularity, or resist coating irregularity. Therefore, in the pattern writing, the dimension is corrected by the variation in dimension in advance to make it possible to write a predetermined pattern. Therefore, it is possible to form a pattern having a precise dimension.

Second Embodiment

In the first embodiment, when the resist film is coated, it is assumed that the resist film has a uniform film thickness h over the entire surface of the target workpiece. However, resist coating irregularity may also occur. Therefore, in the second embodiment, a configuration which measures a film thickness before the pre-development is added.

Figure 9:
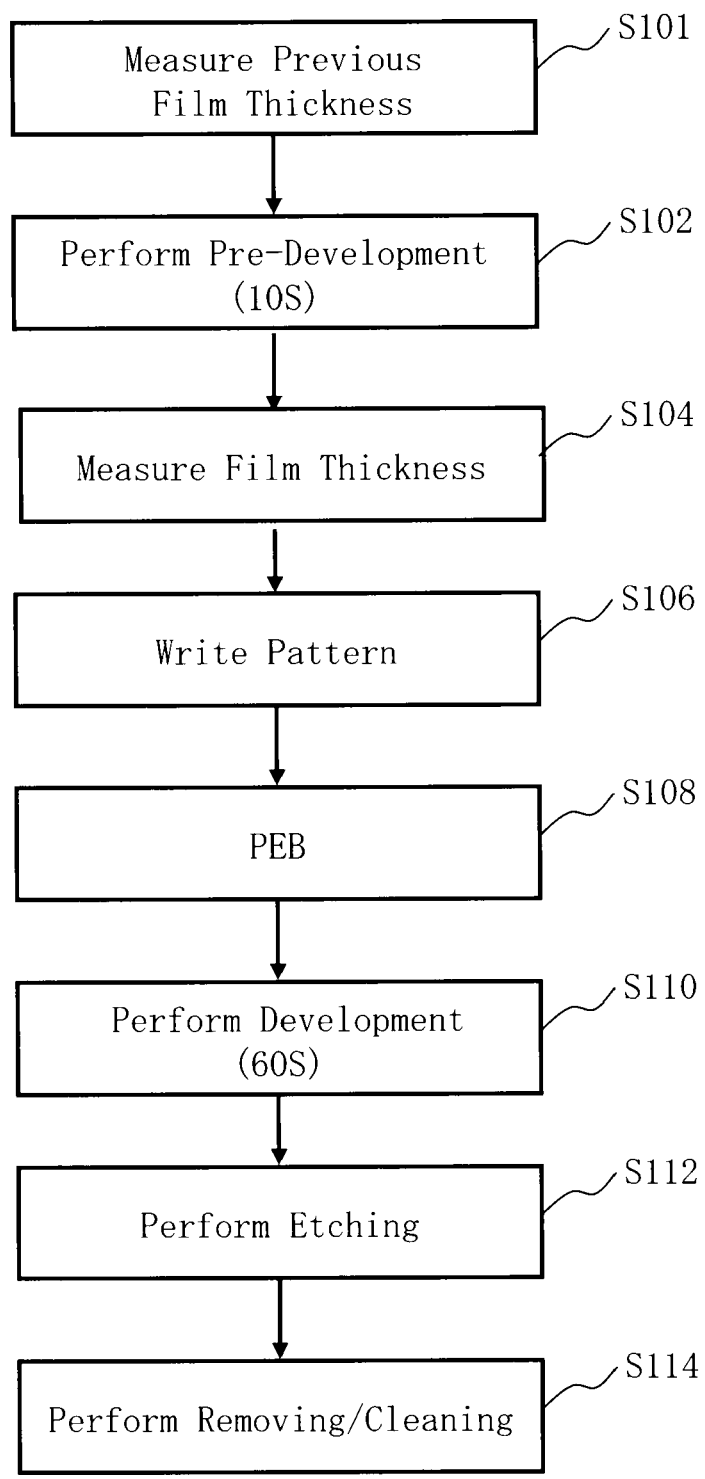
FIG. 9 is a flow chart showing main steps of a pattern forming method according to the second embodiment.

FIG. 9 is a flow chart showing main steps of the pattern forming method according to the second embodiment.

In FIG. 9, the pattern forming method is the same as that in FIG. 5 except that the previous film thickness measuring step (S101) which measures a film thickness of a resist film is added before the pre-developing step (S102).

Figure 10A:
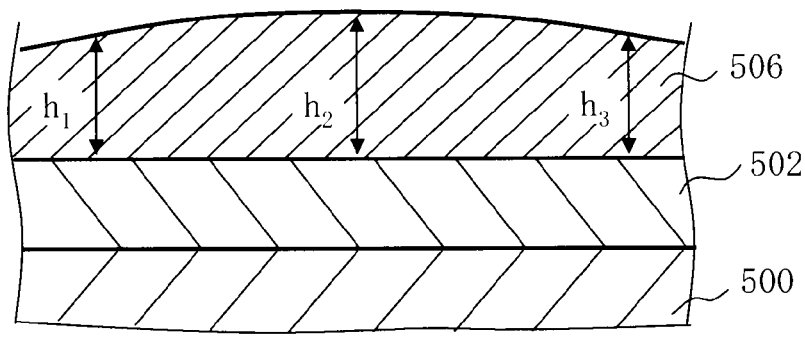
FIGS. 10A and 10B are diagrams for explaining coating irregularity in the second embodiment.
Figure 10B:
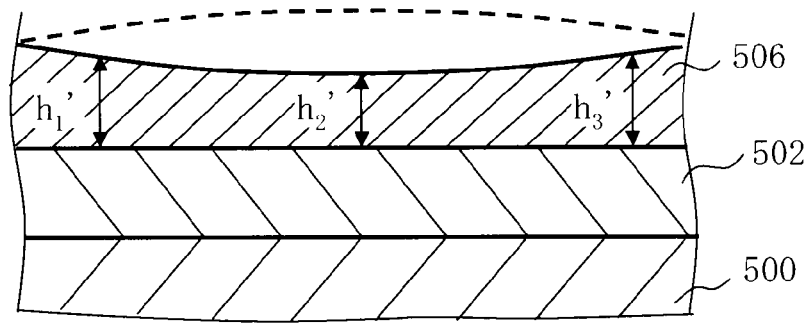
Figure 11:
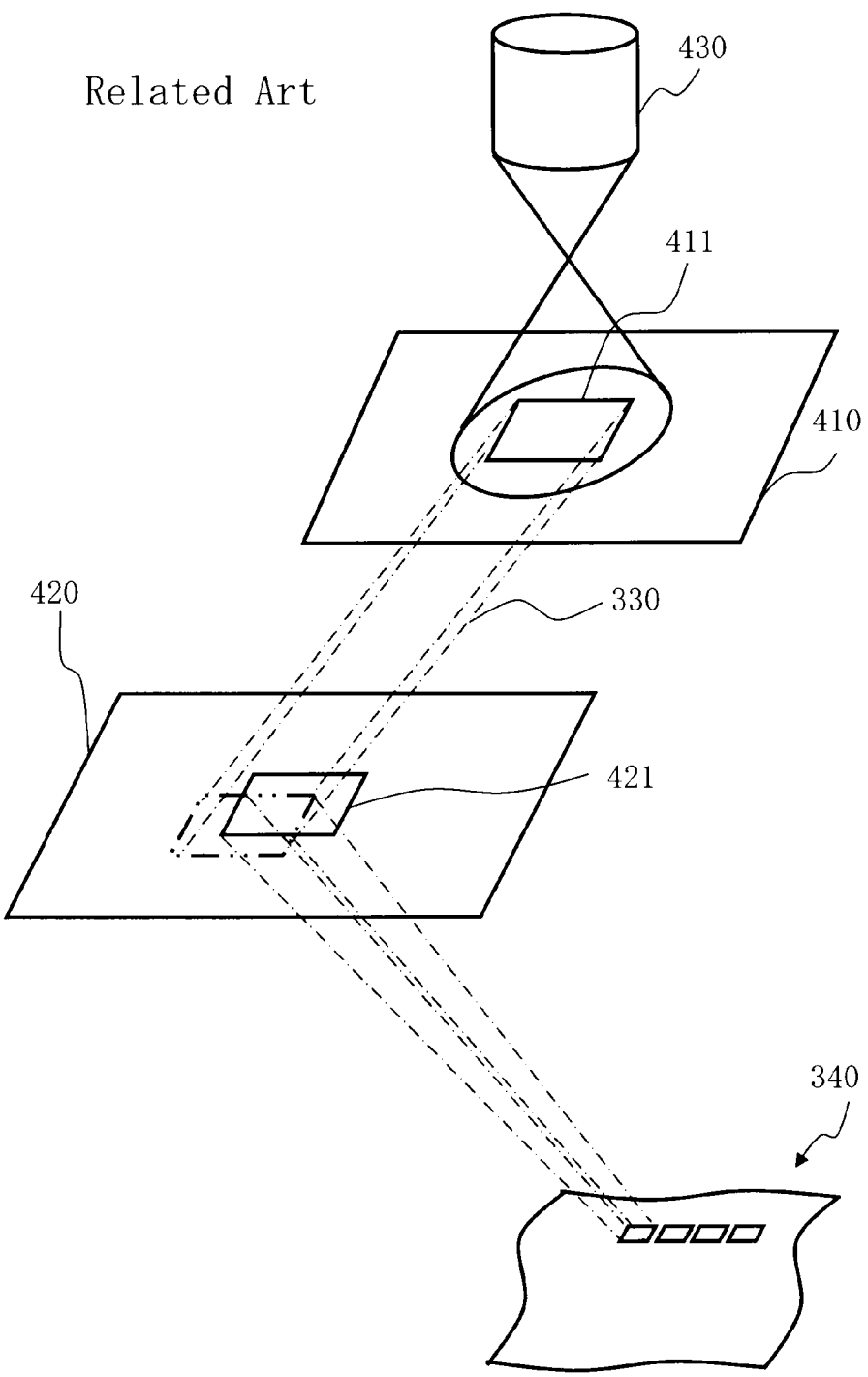
FIG. 11 is a conceptual diagram for explaining an operation of a conventional variable shaping electron beam writing apparatus.

FIGS. 10A and 10B are diagrams for explaining coating irregularity in the second embodiment.

The surface of the resist film 506 does not have a uniform film thickness h over the entire area of the target workpiece. As shown in FIG. 10A, coating irregularity of the resist may also occur at some positions. Therefore, as the pre-developing step, before the resist development for the first period of time t1, the film thickness of the resist film 506 is measured. Measurement positions may be the positions shown in FIG. 7. The pre-developing step (S102) to the film thickness measuring step (S104) are the same as those in the first embodiment. In the pattern writing step, the control calculator 120 receives both the film thicknesses h and h' of the resist film 506 obtained by the film thickness measurement performed before and after the development through the I/F circuit 180. FIG. 10A shows film thicknesses h1 to h3 serving as examples of the film thicknesses h of the resist film 506 obtained by the previous film thickness measurement performed before the development. FIG. 10B shows film thicknesses h'1 to h'3 of examples of the film thicknesses h' of the resist film 506 obtained by the film thickness measurement performed after the development. A difference between the film thicknesses h and h' is calculated to calculate an amount of reduction in film thickness Δh. The control calculator 120 reads correlation data between the film thickness h' and the ΔCD and correlation data between the amount of reduction in film thickness Δh and the ΔCD from a magnetic disk device 146 to generate correction data to correct a dimension of the predetermined pattern on the basis of the film thickness h' and the amount of reduction in film thickness Δh. The subsequent steps are the same as those in the first embodiment.

With the above configuration, a variation in pattern caused by development irregularity between the chemical amplification type resist and the substrate, resist irregularity, or coating irregularity of the resist can be corrected.

The embodiments have been described with reference to concrete examples. However, the present invention is not limited to these concrete examples. For example, the same effect can be achieved in not only a mask substrate but also a silicon substrate for a semiconductor device.

Parts such as an apparatus configuration and a control method which are not directly necessary for the explanation of the present invention are omitted. However, a necessary apparatus configuration and a necessary control method can be arbitrarily selected and used. For example, a description of a control unit configuration for controlling the writing apparatus 100 is omitted. However, a necessary control unit configuration can be arbitrarily selected and used, as a matter of course.

Furthermore, all pattern forming methods, all charged particle beam writing apparatuses, and methods therefor which include the elements of the present invention and which can be arbitrary changed in design by a person skilled in the art are included in the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A pattern forming method comprising:
    performing a first resist development during a first time period to a substrate obtained by coating a resist film having a predetermined thickness onto a predetermined film to be etched;
    measuring the film thickness of the resist film after the first resist development;
    writing a predetermined pattern, corrected in dimension on the basis of an amount of reduction in thickness of the resist film, on the resist film by using a charged particle beam;
    performing a second resist development during a second time period which is longer than the first time period to the substrate after writing the pattern; and
    etching the predetermined film to be etched by using the resist film after the second resist development as a mask.

2. The method according to claim 1, wherein the dimension is corrected to a first value, obtained by a second value acquired by using the amount of reduction in thickness and a ratio of the first time to the second time, from the original dimension.

3. The method according to claim 1, further comprising measuring a film thickness of the resist film before the first resist development.

4. The method according to claim 1, wherein the first time is set to make an amount of reduction in thickness not more than 5%.

5. The method according to claim 1, wherein, as a material of the resist film, a chemical amplification type resist is used.

6. The method according to claim 1, wherein, as a material of the resist film, a main-chain-scission type resist is used.

7. The method according to claim 1, wherein the dimension is corrected on the basis of amounts of reduction in thickness depending on a plurality of positions of the substrate.

8. The method according to claim 1, wherein the dimension is corrected by using a correlation between the amount of reduction in thickness and the dimension.

9. The method according to claim 8, wherein
    the correlation is obtained by a value measured by using an evaluation substrate to which a second resist film is coated, and
    as a material of the resist film, the same material as that of the second resist film is used.

* * * * *